US006963212B2

(12) United States Patent
Brown

(10) Patent No.: US 6,963,212 B2
(45) Date of Patent: Nov. 8, 2005

(54) SELF-TESTING INPUT/OUTPUT PAD

(75) Inventor: Charles Allen Brown, Corvallis, OR (US)

(73) Assignee: Agilent Technologies, Inc., Palo Alto, CA (US)

( * ) Notice: Subject to any disclaimer, the term of this patent is extended or adjusted under 35 U.S.C. 154(b) by 35 days.

(21) Appl. No.: 10/807,630

(22) Filed: Mar. 23, 2004

(65) Prior Publication Data
US 2005/0212542 A1 Sep. 29, 2005

(51) Int. Cl.[7] ............................................ G01R 31/02
(52) U.S. Cl. .................... 324/763; 324/765; 324/158.1
(58) Field of Search ........................... 324/73.1, 76.11, 324/763, 765, 158.1; 714/724, 733; 702/117

(56) References Cited

U.S. PATENT DOCUMENTS 5,796,260 A * 8/1998 Agan ........................ 324/537
6,586,921 B1 * 7/2003 Sunter ..................... 324/76.11
6,658,613 B2 * 12/2003 Rearick et al. ............. 714/724
6,762,614 B2 * 7/2004 Rearick et al. ............. 324/763
6,859,059 B2 * 2/2005 Rohrbaugh et al. ......... 324/763

* cited by examiner

Primary Examiner—Paresh Patel

(57) ABSTRACT

The present invention teaches an apparatus for testing the circuitry in an input/output (I/O) pad without probing the contact site on the I/O pad. A dominant driving circuit has an output coupled to a first contact site on a semiconductor chip. A subordinate driving circuit also has an output coupled to the first contact site on the semiconductor chip. A test control circuit sets a drive fight up between the dominant and subordinate driving circuits, the test control circuit selecting a stronger drive strength for the dominant driving circuit than for the subordinate driving circuit. The drive fight produces a test value at the first contact site. The test value from the first contact site is transferred to a second contact site on the semiconductor chip to be probed by an external prober.

17 Claims, 5 Drawing Sheets

SELF-TESTING INPUT/OUTPUT PAD

BACKGROUND OF THE INVENTION

Input/output (I/O) pads are the interface between the core of an integrated circuit and external circuitry. Each I/O pad includes a contact site, which is an area where an electrical connection can be made between the core of the integrated circuit and external circuitry. I/O pads also include auxiliary circuits, such as electrostatic discharge (ESD) circuitry that protects the core from damage due to electrostatic discharge, and output driver circuitry designed to buffer the output so that it can drive an off-chip load.

Due to area constraints in semiconductor design, the large sizes required for the output driver transistors in I/O pads are typically achieved by connecting multiple smaller transistors in parallel. FIG. 1A shows a transistor 101 that is designed to have a width of W and a length of L. In physical layout however, transistor 101 may be "folded"—that is, made into smaller transistors connected in parallel—to accommodate space constraints of the integrated circuit. FIG. 1B shows transistors 103A, 103B, and 103C connected in parallel, each having a width of W/3 and a length of L. The transistors 103A–C of FIG. 1B, taken together, have the equivalent drive strength of transistor 101 in FIG. 1A.

Manufacturing defects may disable one or more of the transistors in a parallel configuration such as FIG. 1B, diminishing the full drive strength of the output driver. To detect such a defect, the conventional method is to probe the contact site with mechanical probes (typically arranged on a probe card) that introduce a test load at the contact site. Then, the current flowing through the output driver is measured. If the current measured matches the expected drive strength of the transistors, then each of the parallel transistors is operating as expected. However, if the current is less than expected, then at least one of the transistors is not operative, and the full drive strength of the output driver is not available.

The conventional test method requires that the contact site be physically probed in order to present a load to the contact site, or to run a variety of other tests that confirm the functionality of the circuits within the I/O pad. However, the number of I/O pads is continually increasing, and the size of the semiconductor devices is continually shrinking. Consequently, the arrangement of the probes on the probe card grows denser and more complicated, and the probe card becomes more expensive to manufacture. Furthermore, the process of making a physical connection between the probes and the contact site may damage the I/O pads and the probes.

SUMMARY OF THE INVENTION

In a preferred embodiment, the present invention utilizes the parallel transistor design of I/O pad output drivers to test the I/O pad circuitry without physically probing the I/O pad. A pull-up circuit and a pull-down circuit drive the output of an I/O pad. Each circuit includes transistors formed in parallel to one another. The drive strength of the pull-up and pull-down circuits can be varied by enabling or disabling a number of transistors as required.

A test control circuit sets up drive fights between the pull-up circuit and the pull-down circuit at the contact site of the I/O pad to test the drive strength of each circuit. Either the pull-up or the pull-down circuit is enabled with more drive strength than the other, allowing it to overdrive the other circuit. The circuit having greater drive strength is referred to as the "dominant" circuit; the circuit having lesser drive strength is referred to as the "subordinate" circuit. For example, when the pull-up circuit is the dominant circuit, then the pull-down circuit becomes the subordinate circuit. Conversely, when the pull-down circuit is the dominant circuit, then the pull-up circuit becomes the subordinate circuit.

The drive strength of the dominant circuit is tested by enabling the number of transistors needed within the dominant circuit to overdrive the subordinate circuit. When the dominant circuit wins the drive fight, the enabled transistors in the dominant circuit are functional. Otherwise, the transistors may be defective, or there may be some other fault within the dominant circuit.

The resulting test value at the contact site is shifted from the contact site to another contact site at a second I/O pad via a boundary shift register. The boundary shift register is typically used to facilitate board-level debugging and testing. The physical probing of the test value is performed at the second I/O pad. The I/O pad of the circuitry under test remains unprobed. This protects the I/O pad from damage by a prober, and reduces the density of the probe tips on the probe cards. In this manner, multiple I/O pads on the chip can be tested by probing just a single I/O pad. The present invention is especially useful when semiconductor chips are tested while still on the wafer, at the reticle level. When the boundary scan chains of all the die on one reticle are connected together, the pads of multiple die can be tested at one I/O pad on the reticle.

Further features and advantages of the present invention, as well as the structure and operation of preferred embodiments of the present invention, are described in detail below with reference to the accompanying exemplary drawings.

DETAILED DESCRIPTION

Figure 1A:
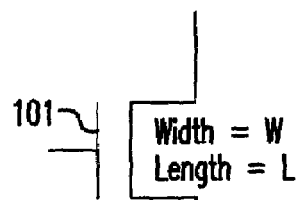
FIG. 1A shows a single transistor.
Figure 1B:
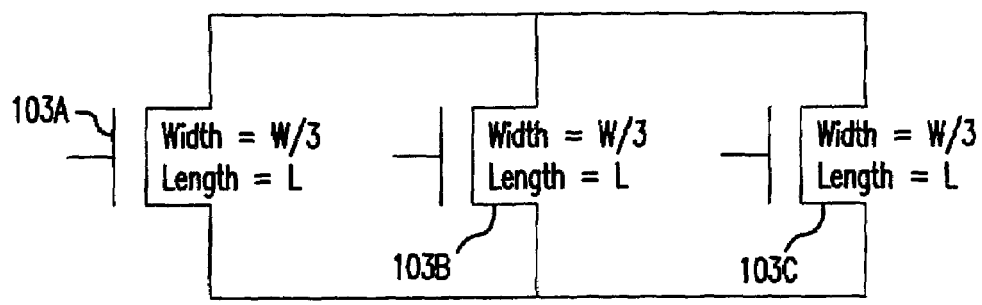
FIG. 1B shows three transistors connected in parallel that are equivalent to the transistor in FIG. 1A.
Figure 2:
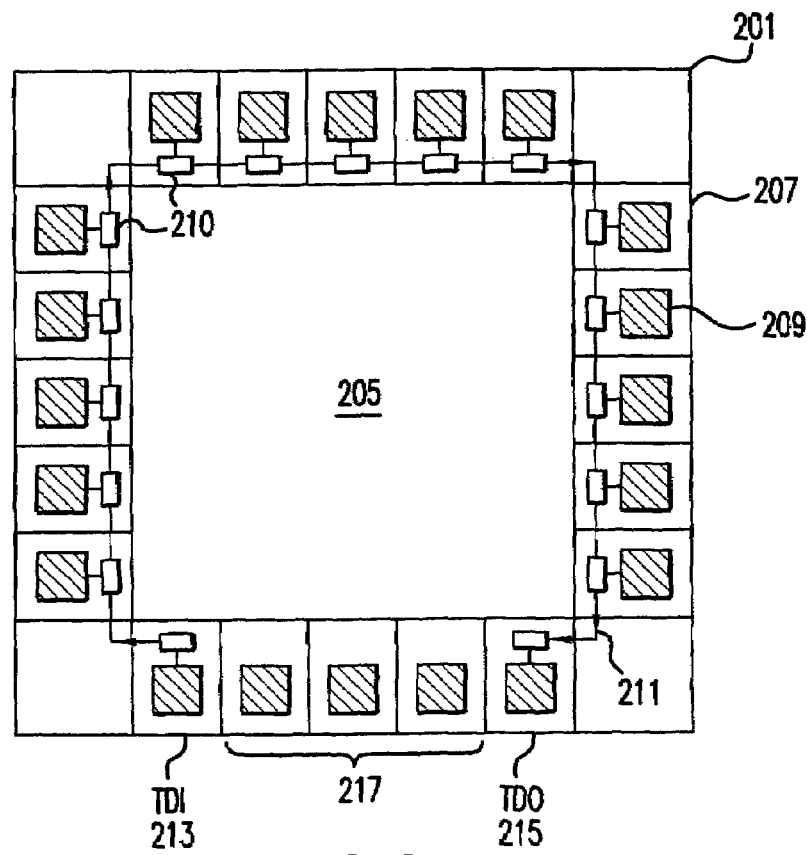
FIG. 2 shows a simplified high-level diagram of a typical semiconductor chip.
Figure 3:
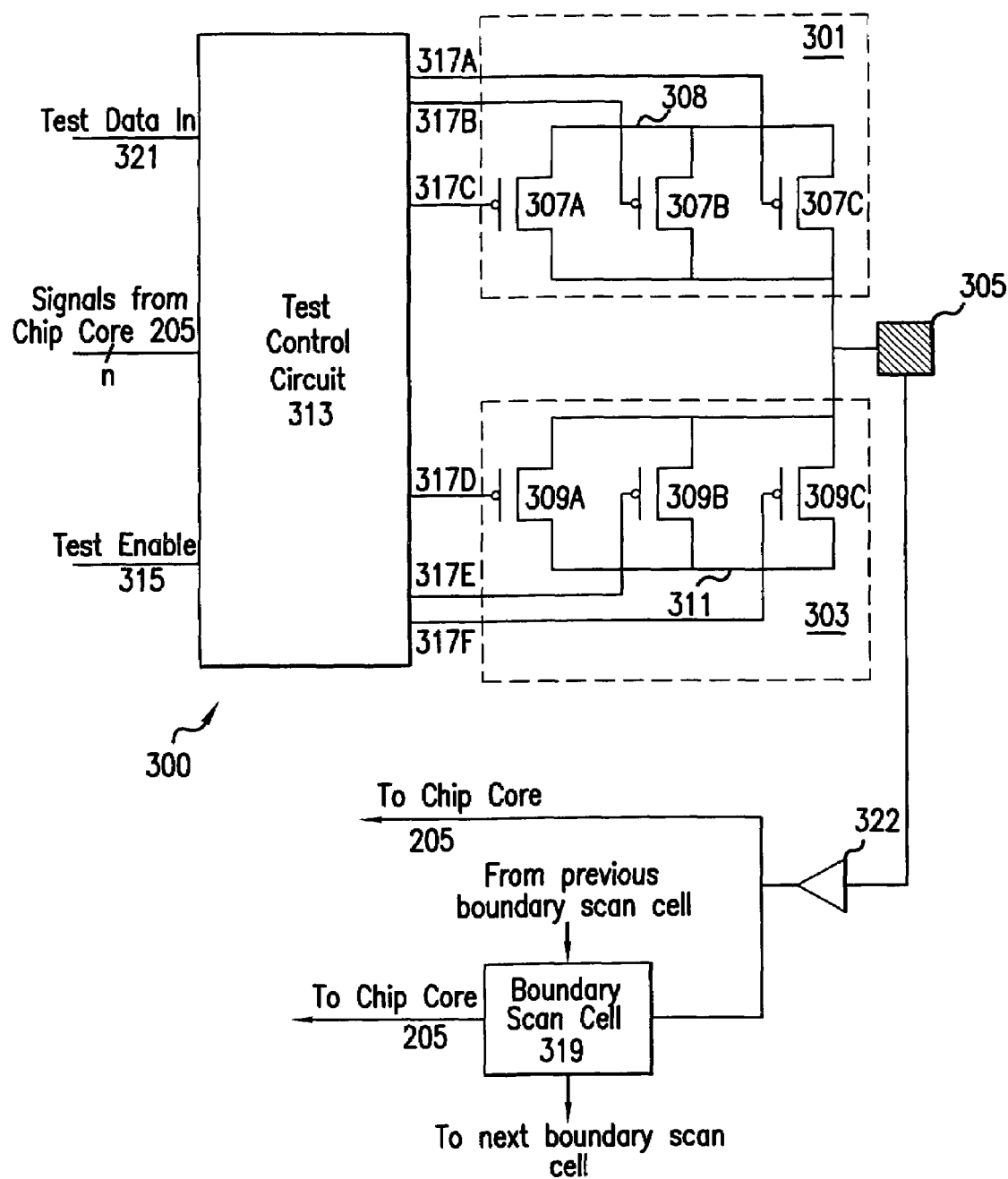
FIG. 3 shows a single I/O pad in a partial schematic form.

FIGS. 2 & 3 show a preferred embodiment made in accordance with the teachings of the present invention. FIG. 2 shows a simplified high-level diagram of a typical semiconductor chip 201. The semiconductor chip 201 has a chip core 205 and multiple I/O pads 207 around the periphery of the chip 201. Each I/O pad 207 has a contact site 209 where a connection can be made to the external world for the purposes of bonding, probing, etc.

The contact sites 209 of a semiconductor chip are typically coupled to boundary scan cells 210. Boundary scan cells 210 are memory cells that are linked together to form a boundary shift register 211 around the boundary of the semiconductor chip 201. They are commonly used to facilitate board level testing and are well known in the art. The entry and exit points of the boundary shift register 211 are connected to a Test Data In (TDI) pad 213 and a Test Data Out (TDO) pad 215 respectively. Some pads 217 are also reserved for controlling the boundary scan cells 209 during test, such as for a clock input, a test mode select, etc. By shifting test vectors into the boundary shift register 211 through the TDI pad 213, an external tester can control the values at the I/O pads 207 and perform various tests, typically at the board level. The values at contact sites 209 can also be captured by the local boundary scan cell 210 and shifted to the TDO pad 215. A suitable boundary scan cell for use is one that complies with the Institute of Electrical and Electronics Engineers (IEEE) 1149.1 standard.

FIG. 3 shows a single I/O pad 300 in a partial schematic form. A pull-up circuit 301 and a pull-down circuit 303 are connected to the contact site 305. The pull-up circuit 301 is a parallel circuit, with a plurality of transistors 307A, 307B, and 307C, connected in parallel with one another between the contact site 305 and a power source 308. A parallel circuit, as used hereinafter, is defined to be a circuit having a plurality of branches connected in parallel between two nodes, each branch forming a path through which current can flow between the two nodes. The pull-down circuit 303 is also a parallel circuit, with a plurality of transistors 309A, 309B, and 309C, connected in parallel with one another between the contact site 305 and ground 311. Each transistor has an input that switches the transistor on or off. The pull-up circuit 301 and the pull-down circuit 303 form the output drivers for the I/O pad 300. It should be understood that although the pull-up circuit 301 shows only three branches in parallel, it may have fewer or more branches formed in parallel. Similarly, although the pull-down circuit 303 shows only three branches formed in parallel in FIG. 3, it may have fewer or more branches formed in parallel. Furthermore, although each branch of the pull-up or pull-down circuit is shown with only a single transistor, multiple transistors in series, in parallel, or in series and parallel, may be used in each branch without departing from the scope of the present invention. And although the figures are illustrated with field-effect transistors, the present invention is applicable to any transistor that can be folded into a parallel circuit.

The contact site 305 is connected to an input buffer 322 that feeds into a boundary scan cell 319 and to the chip core 205. The boundary scan cell 319 is one cell in a boundary shift register on the chip, like the boundary shift register 211 in FIG. 2.

A test control circuit 313 has a test enable signal 315 that switches the test control circuit 313 between test mode and normal operation, and generates control signals 317A–F to control the transistors 307A–C and 309A–C. During normal operation, the control signals 317A–F for the transistors come from the chip core 205. Generally, all of the pull-up or pull-down transistors are enabled or disabled together for maximum drive strength at the output when the test control circuit 313 is in normal operation. (In some applications, only some of the pull-up or pull-down transistors may be enabled when a weaker output drive strength is desired.)

In test mode, however, the control signals 317A–F are generated by the test control circuit 313. The control signals 317A–F vary the drive strength of the pull-up and pull-down circuits by enabling or disabling the transistors. One of the circuits is enabled with more drive strength than the other. The circuit having greater drive strength will be hereinafter referred to as the "dominant" circuit. The other circuit, having lesser drive strength, will be hereinafter referred to as the "subordinate" circuit. For example, when the pull-up circuit is the dominant circuit, then the pull-down circuit becomes the subordinate circuit. Conversely, when the pull-down circuit is the dominant circuit, then the pull-up circuit becomes the subordinate circuit. By creating drive fights between the dominant and the subordinate circuit at the contact site 305, the drive strength of each circuit can be tested.

The drive strength of the dominant circuit is tested by enabling the number of transistors needed within the dominant circuit to overdrive the subordinate circuit. The actual number of transistors that are enabled to overdrive the subordinate circuit will vary depending on the process and design used, as well as the accuracy desired in testing. When the dominant circuit wins the drive fight, the enabled transistors in the dominant circuit are functional. Otherwise, the transistors may be defective, or there may be some other fault within the dominant circuit. This process is repeated for all the transistors until they are all verified.

Figure 4:
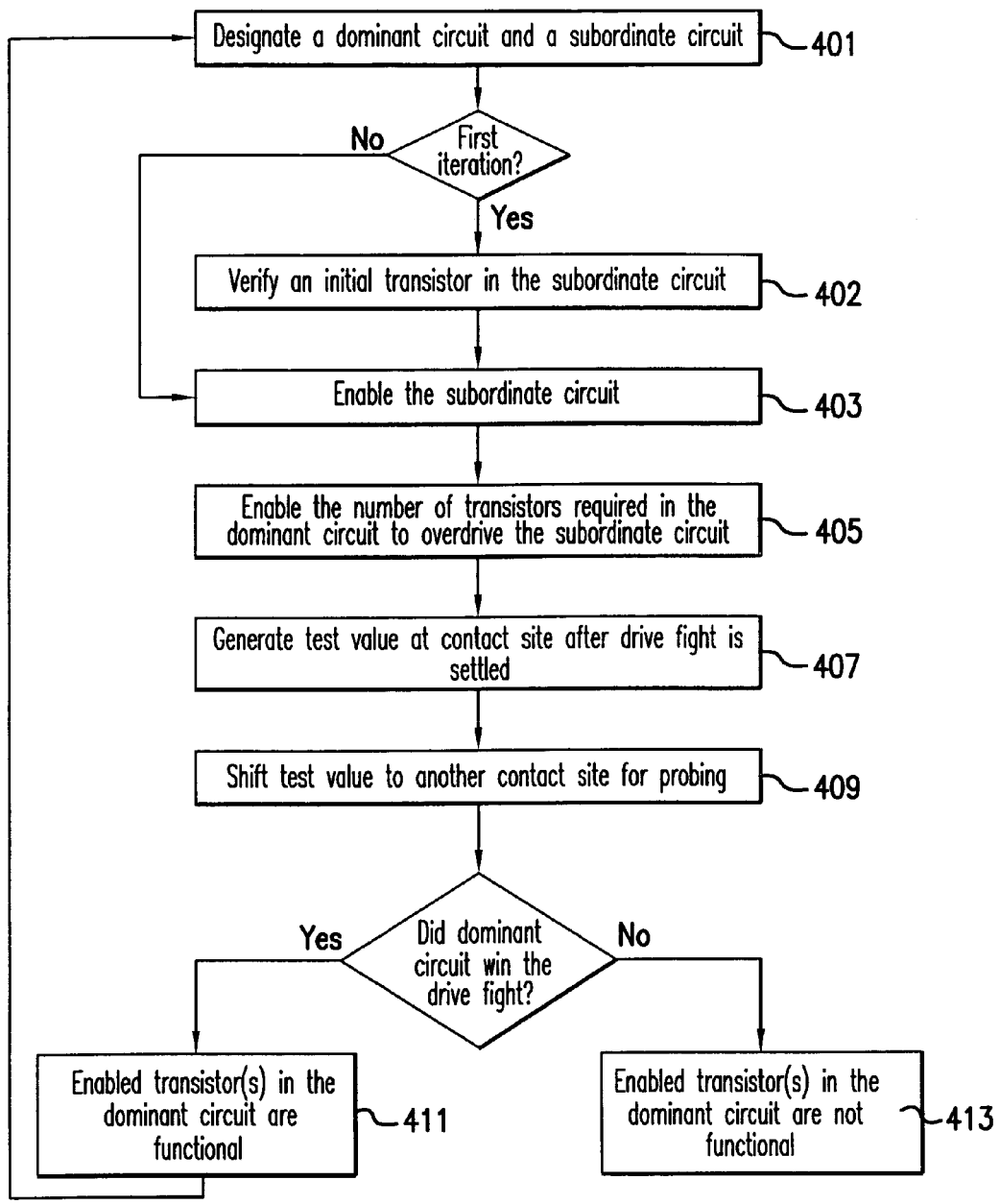
FIG. 4 is a flow chart illustrating the steps that the test control circuit runs through to test the functionality of the I/O driver circuitry.

FIG. 4 illustrates a flow chart of the steps that the test control circuit 313 runs through to test the functionality of the pull-up and pull-down circuitry while in test mode. Initially in step 401, the test control circuit 313 designates a dominant and a subordinate circuit for this round of testing. If the pull-up circuit 301 is designated as the dominant circuit, then the pull-down circuit 303 is designated as the subordinate circuit, and vice versa.

If this is the first iteration of this test, step 402 is the next step; otherwise step 402 can be skipped and step 403 is the next step. In step 402, a single transistor in the subordinate circuit has its drive strength verified so that it can serve as an initial known working transistor. The process for verifying the initial transistor will be discussed in further detail later. Once the initial transistor has been verified, the dominant circuit can be tested. This initial verification process is only required in the first iteration of this test process in FIG. 4. Once other transistors have been verified, this step can be skipped in subsequent iterations, since other verified transistors can serve as known working transistors.

In step 403, the test control circuit 313 enables the verified transistor(s) in the subordinate circuit. Then in step 405, the test control circuit 313 enables the number of transistors required in the dominant circuit to overdrive the subordinate circuit, such that the dominant and subordinate circuits are in a drive fight. Although step 403 comes before step 405 in the flow chart, the order of these two steps may be reversed, or run concurrently.

In step 407, a test value for the dominant circuit is generated at the contact site 305 once the drive fight settles. In step 409, the test value at the contact site 305 is captured by the boundary scan cell 319 in the I/O pad 300, and shifted via the boundary shift register 211 to the TDO pad 215 of the chip 201.

The TDO pad 215 is physically probed by an external prober to check the test value, leaving the contact site 305 itself unprobed. The test value indicates which circuit won the drive fight. When the enabled transistors in the dominant circuit are functioning correctly, the dominant circuit will win the fight (result 411). When one or more of the enabled dominant transistors is defective, however, then the dominant circuit will not win the drive fight, and the test value will either be indeterminate or remain driven by the subordinate circuit (result 413). When the transistor sizes and the number of transistors enabled per group are chosen appropriately, the fights mentioned can be controlled to produce the expected results. The appropriate sizes and groupings of the transistors will vary depending on the process and design used.

The dominant and subordinate circuits can now exchange roles, with the newly verified transistor(s) serving as the known working transistors in the subordinate circuit. Steps 401 through 409 are repeated with different sets of transistors enabled, and by switching the roles of the dominant and subordinate circuits, until all of the transistors are verified.

Figure 5:
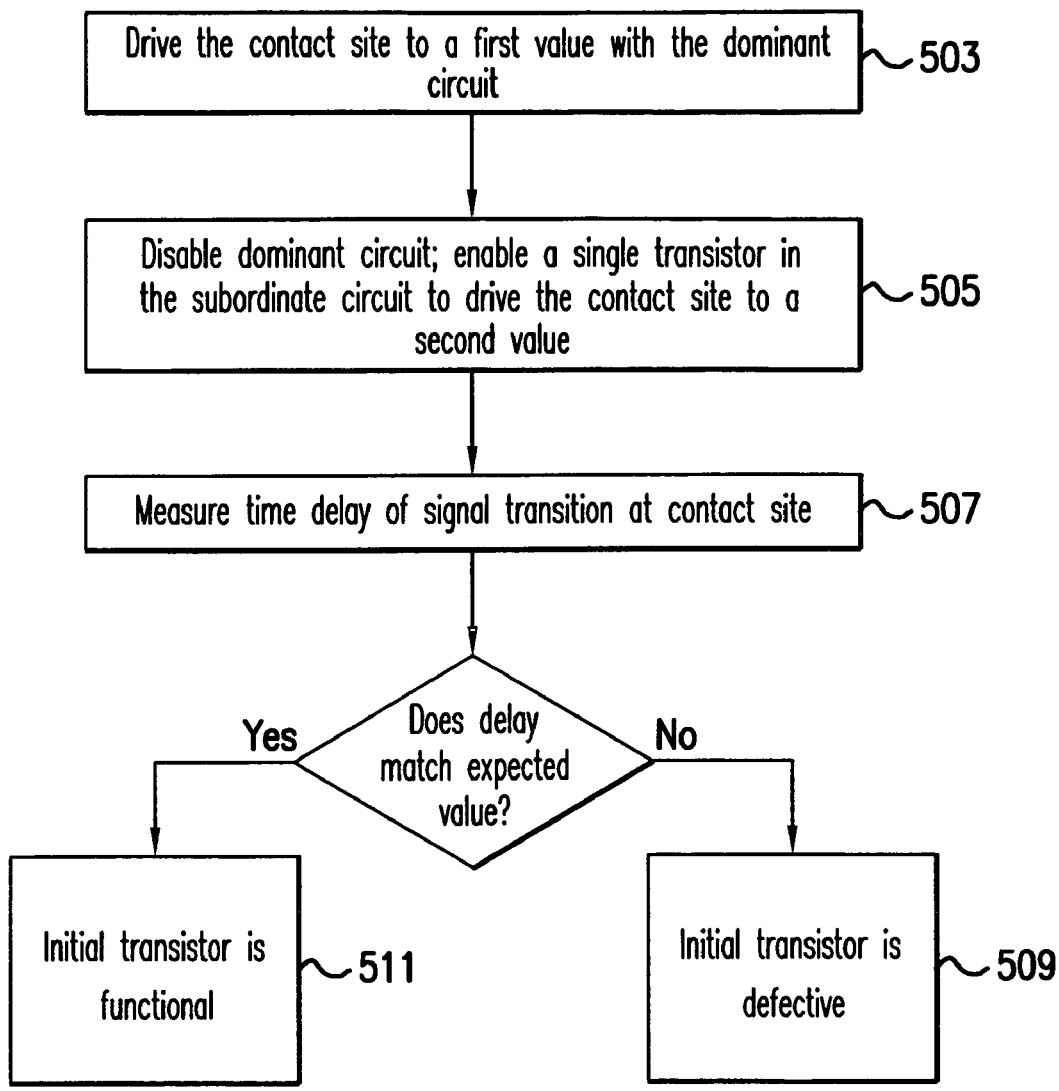
FIG. 5 is a flow chart illustrating the steps of verifying an initial subordinate transistor.

FIG. 5 is a flow chart illustrating the steps of verifying an initial subordinate transistor, as required in step 402 of FIG. 4. In step 503, the contact site 305 is driven to a first value by the dominant circuit by enabling one or more transistors in the dominant circuit. Then in step 505, the test control circuit 313 disables all of the transistors in the dominant circuit and enables a single subordinate transistor to drive the contact site 305 to a second value, distinct from the first. In step 507, the time delay of the transition between values at the contact site 305 is measured. This delay is indicative of the drive strength of the enabled subordinate transistor. If it takes longer than expected for the transition to occur, then the drive strength of the subordinate transistor is weak and there may be a defect (result 509). If the transition at contact site 305 happens within the expected time, then the subordinate transistor is functioning normally (result 511) and has been verified as the initial transistor. The expected time required for the transition to occur can be determined through circuit simulations, such as with a SPICE (Simulation Program with Integrated Circuit Emphasis) program. Each transistor within the dominant and subordinate circuit may be tested in a similar manner.

It should be noted that measuring the delay of the transition is a dynamic rather than a static test, a boundary scan cell that simply captures DC value of a signal at a given time will not be able to measure the delay. The boundary scan cell needs to be capable of AC measurements as well. A suitable boundary scan cell is one that complies with the IEEE 1149.6 standard.

Figure 6A:
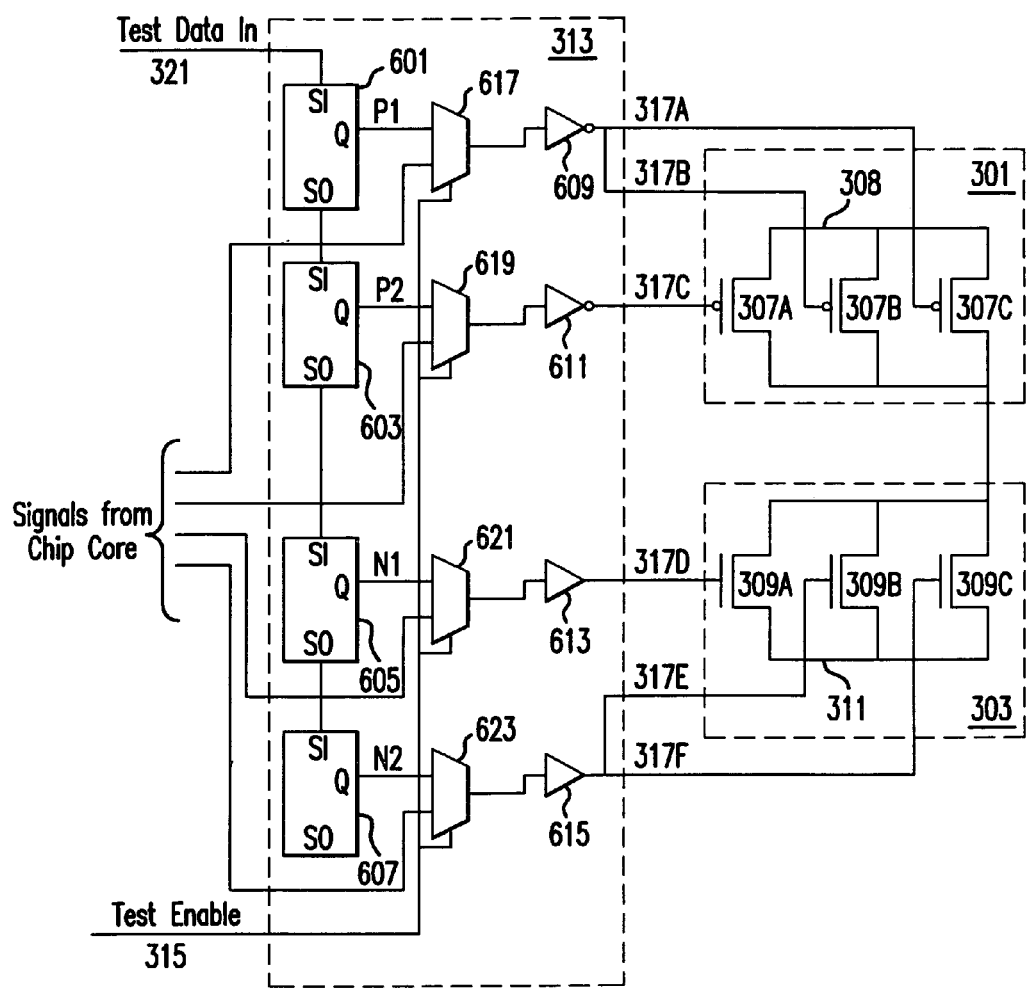
FIG. 6A shows one possible configuration for the test control circuit.

FIG. 6A shows a more detailed view of a test control circuit 313 for implementing the test process described above. It should be understood that FIG. 6A is only one possible configuration for test control circuit 313, but there are many other circuit configurations that will perform the same functions. The pull-up and pull-down circuits 301, 303 are shown as well for the sake of clarity. Four scan flip-flops 601, 603, 605, and 607 are linked together into a scan chain. The scan input to scan flip-flop 601 is the signal Test Data In 321 to the test control circuit 313. The scan output (SO) of scan flip-flop 601 is connected to the scan input (SI) of scan flip-flop 603. The SO of scan flip-flop 603 is connected to the SI of scan flip-flop 605. Finally, the SO of scan flip-flop 605 is connected to the SI of scan flip-flop 607.

Figure 6B:
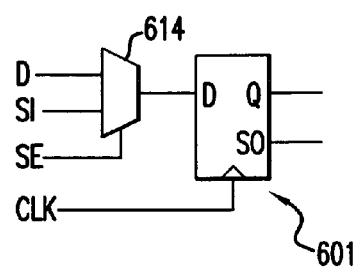
FIG. 6B shows an expanded view of a scan flip-flop used in the test control circuit of FIG. 6A.

FIG. 6B shows an expanded view of one possible implementation of a scan flip-flop. Scan flip-flops are used in design-for-test (DFT) methodologies. A scan flip-flop is essentially a D flip-flop 612 with a multiplexer 614 selecting between D and scan in (SI) inputs to feed into the input of the D flip-flop 612. By toggling the select enable (SE) switch, the multiplexer 614 switches between an input D used during normal operation, and a scan input SI that is used during test mode. The D flip-flop has a clock input CLK, and an extra scan out (SO) output that mirrors the Q output. The SO output is used for linking up multiple scan flip-flops into a scan register—the SO of one scan flip-flop is connected to the SI of a next scan flip-flop to form a shift register. During test, the desired test vectors can be shifted into the scan chain for testing the circuitry. The D, CLK, and SE inputs are not shown in FIG. 6A because they are not necessary to the understanding of the present invention.

Referring back to FIG. 6A, four two-input multiplexers 617, 619, 621, and 623 have their selectors connected to the test enable signal 315. Multiplexers 617, 619, 621, and 623 have their first inputs connected to the Q output of scan flip-flop 601 (node P1), the Q output of scan flip-flop 603 (node P2), the Q output of scan flip-flop 605 (node N1), and the Q output of scan flip-flop 607 (node N2), respectively. Each of the multiplexers 617–623 has its second input connected to a signal from the chip core 205. When the test enable signal 315 is asserted, the multiplexers 617–623 select the outputs of the scan flip-flops 601–607. When the test enable signal 315 is unasserted, the multiplexers 617–623 select the signals from the chip core 205.

The outputs of multiplexers 617 and 619 are connected to inverting buffers 609 and 611, respectively. The output of inverting buffer 609 is the two control signals 317A and 317B, which control pull-up transistors 307B and 307C. The output of inverting buffer 611 is the control signals 317C, which controls pull-up transistor 307A.

The outputs of multiplexers 621 and 623 are connected to non-inverting buffers 613 and 615, respectively. The output of non-inverting buffer 615 is the two control signals 317E and 317F, which control pull-down transistors 309B and 309C. The output of non-inverting buffer 613 is the control signals 317D, which controls pull-down transistor 309A.

When the test enable signal 315 is asserted, the test control circuit 313 switches into test mode. By shifting in the proper test vectors through the Test Data In 321, the test control circuit 313 can control the pull-up and pull-down transistors according to the steps described in the flow charts of FIGS. 4 and 5.

It is instructive to run through a few example patterns to illustrate the present invention. For example, suppose the pull-up circuit is designated as the dominant circuit, and the pull-down circuit is designated as the subordinate circuit.

Step 1: To verify the initial subordinate transistor, the test control circuit 313 shifts in a first test vector such that P1=1, P2=1, N1=0, and N2=0. All of the transistors 307A–C in the pull-up circuit 301 are enabled, which drives the value at contact site 305 to a 1. This signal is sampled by the boundary scan cell 319.

Step 2: Next, the test control circuit 313 shifts in a second test vector such that P1=0, P2=0, N1=1, and N2=0. Now only the single transistor 309A is pulling the contact site 305 to a 0. Immediate sampling of the contact site using the boundary scan cell 319 will show that the 1 is still there. By repeating steps 1 and 2 with more delay, we can determine the delay of the transition from a 1 to a 0 at contact site 305, and thus determine the drive strength available in the transistor 309A. Once the initial pull-down transistor has been verified, the transistors in the pull-up circuit can be tested.

Step 3: Now the test control circuit 313 shifts in a test vector such that P1=1, P2=0, N1=1, and N2=0. This set up enables pull-up transistors 307B and 307C, and pull-down transistor 309A. This produces a drive fight between the pull-up and pull-down circuits, which the pull-up circuit should win since there are two pull-up transistors enabled (307B and 307C) as opposed to just one pull-down transistor (309A). If contact site 305 is not pulled high, then one or more of the pull-up transistors may be defective. The test value at contact site 305 will indicate this defect by either remaining low, or being an indeterminate value. If, however, transistors 307B and 307C are functioning correctly, they should overdrive pull-down transistor 309A to generate a test value of 1 at contact site 305. More transistors may need to be enabled in the dominant circuit to produce the expected overdrive result. For example, in some circuits it may be necessary to enable all three transistors 307A–C to overdrive pull-down transistor 309A.

Step 4: The test value generated at contact site 305 is captured by the boundary scan cell 319 local to the I/O pad 300, and shifted via the boundary shift register 211 to the TDO pad 215. The TDO pad 215 is physically probed to determine the test value. If the probed test value at the TDO pad 215 is a 1, then the combination of transistors 207B and 307C is functioning correctly. Otherwise, there may be a defect in the combination. The contact site 305 itself is not physically probed. This test process also tests the input path from the contact site 305 to the chip core 205 simultaneously, since the input buffer 322 and boundary scan cell 319 are a part of the input path to the chip core.

This pattern of testing can be extended to include all transistor groups in the pull-up and pull-down circuits. It should be noted that the number of transistors needed to produce the expected overdrive result will vary depending on the design and process used, the stringency of the verification, and even the transistor type being tested. For example, N-type transistors are typically stronger in a given process than P-type transistors, so it may take more P-type transistors to overdrive an N-type transistor.

Although the present invention has been described in detail with reference to particular preferred embodiments, persons possessing ordinary skill in the art to which this invention pertains will appreciate that various modifications and enhancements may be made without departing from the spirit and scope of the claims that follow.

I claim:

1. An apparatus, comprising:
   a semiconductor chip;
   a first contact site on the semiconductor chip;
   a dominant driving circuit having a first input and a first output coupled to the first contact site, the first output having a variable drive strength responsive to the first input;
   a subordinate driving circuit having a second input and a second output coupled to the first contact site, the second output having a variable drive strength responsive to the second input;
   a test control circuit having a test mode, at least one output coupled to the first input of the first driving circuit, and at least one output coupled to the second input of the second driving circuit,
      the test control circuit operable in test mode to create a drive fight between the dominant and subordinate driving circuits, and to generate a test value at the first contact site;
   a second contact site on the semiconductor chip for probing; and
   a gated signal path connecting the second contact site to the first contact site, operable in test mode to transfer the test value from the first contact site to the second contact site.

2. An apparatus as in claim 1, wherein the test control circuit is operable in the test mode to select a greater output drive strength for the dominant driving circuit than for the subordinate driving circuit, and generate a test value at the first contact site that is indicative of the functionality of the dominant driving circuit.

3. An apparatus as in claim 2, wherein the dominant driving circuit includes
   a first parallel circuit having a plurality of branches connected in parallel between the first contact site and a first node, at least one branch of the first parallel circuit including at least one transistor.

4. An apparatus as in claim 3, wherein each branch of the first parallel circuit includes a transistor.

5. An apparatus as in claim 4, wherein the test control circuit is operable in the test mode to enable a number of transistors required in the dominant driving circuit to overdrive the subordinate driving circuit.

6. An apparatus as in claim 5, wherein the signal path includes
   a shift register for capturing the test value from the first contact site and shifting it to the second contact site.

7. An apparatus as in claim 6, wherein the shift register includes at least one boundary scan cell.

8. An apparatus as in claim 5, wherein the first node is for connection to a power source.

9. An apparatus as in claim 5, wherein the first node is for connection to a ground.

10. An apparatus as in claim 5, wherein the subordinate driving circuit includes
    a second parallel circuit having a plurality of branches connected in parallel between the first contact site and a second node, at least one branch of the second parallel circuit including at least one transistor.

11. An apparatus as in claim 10, wherein each branch of the second parallel circuit includes a transistor.

12. An apparatus as in claim 2, wherein the test control circuit includes a plurality of scan flip-flops linked together to form a scan shift register, at least one scan flip-flop having an output coupled to an input of the dominant driving circuit.

13. A method for testing an input/output (I/O) pad on a semiconductor chip, comprising:
    selecting a first drive strength for a first driving circuit;
    selecting a second drive strength for a second driving circuit, the first drive strength greater than the second drive strength;
    driving a first contact site of the I/O pad with both the first and second driving circuits;
    generating a test value at the first contact site indicative of the drive strength of the first driving circuit; and
    transferring the test value to a second contact site on a second I/O pad.

14. A method as in claim 13, further comprising:
    probing the second contact site with an external prober to determine the test value.

15. A method as in claim 13, wherein transferring the test value includes:
    shifting the test value through a boundary shift register.

16. A method as in claim 14, wherein selecting a first drive strength includes:
    enabling a branch in a parallel circuit in the first driving circuit.

17. A method as in claim 15, wherein selecting a second drive strength includes:
    enabling a branch in a parallel circuit in the second driving circuit.

* * * * *